(12) United States Patent
Ito et al.

(10) Patent No.: US 9,799,524 B2
(45) Date of Patent: Oct. 24, 2017

(54) EXTENDED DRAIN MOS DEVICE FOR FDSOI DEVICES

(71) Applicant: Avago Technologies General IP (Singapore) Pte. Ltd., Singapore (SG)

(72) Inventors: Akira Ito, Irvine, CA (US); Shom Ponoth, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/929,054

(22) Filed: Oct. 30, 2015

(65) Prior Publication Data
US 2017/0018618 A1   Jan. 19, 2017

Related U.S. Application Data

(60) Provisional application No. 62/193,958, filed on Jul. 17, 2015.

(51) Int. Cl.
*H01L 29/417* (2006.01)
*H01L 29/66* (2006.01)
*H01L 21/283* (2006.01)
*H01L 29/06* (2006.01)
*H01L 29/78* (2006.01)
*H01L 21/225* (2006.01)

(52) U.S. Cl.
CPC ...... *H01L 21/283* (2013.01); *H01L 29/66628* (2013.01); *H01L 29/66659* (2013.01)

(58) Field of Classification Search
USPC .......................................... 257/349; 438/161
See application file for complete search history.

(56) References Cited

U.S. PATENT DOCUMENTS

| | | | | |
|---|---|---|---|---|
| 2009/0020806 A1* | 1/2009 | Anderson | ........... | H01L 29/0847 257/327 |
| 2009/0289305 A1* | 11/2009 | Majumdar | .............. | H01L 21/84 257/351 |
| 2013/0126889 A1* | 5/2013 | Bahl | ................. | H01L 29/66462 257/76 |
| 2013/0153929 A1* | 6/2013 | Doris | ................ | H01L 21/28114 257/77 |
| 2013/0175622 A1* | 7/2013 | Haran | ..................... | H01L 21/84 257/347 |
| 2014/0131735 A1* | 5/2014 | Hoentschel | ............. | H01L 21/84 257/77 |
| 2016/0118499 A1* | 4/2016 | Moll | ................. | H01L 29/66628 257/347 |
| 2016/0163850 A1* | 6/2016 | Liu | ....................... | H01L 29/785 257/338 |

* cited by examiner

*Primary Examiner* — Zandra Smith
*Assistant Examiner* — Lawrence Tynes, Jr.
(74) *Attorney, Agent, or Firm* — Sterne, Kessler, Goldstein & Fox P.L.L.C.

(57) ABSTRACT

A field effect transistor (FET) with raised source/drain region of the device so as to constrain the epitaxial growth of the drain region. The arrangement of the spacer layer is created by depositing a photoresist over the extended drain layer during a photolithographic process.

22 Claims, 7 Drawing Sheets

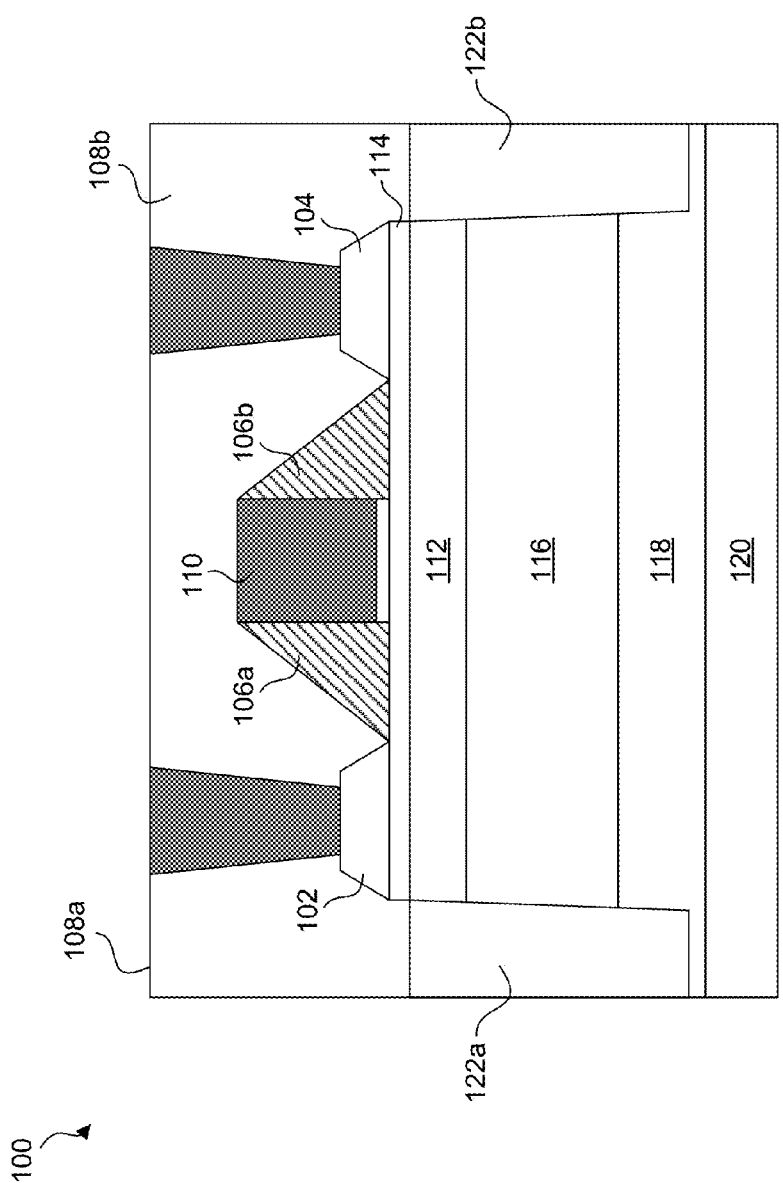
FIG. 1 (Conventional)

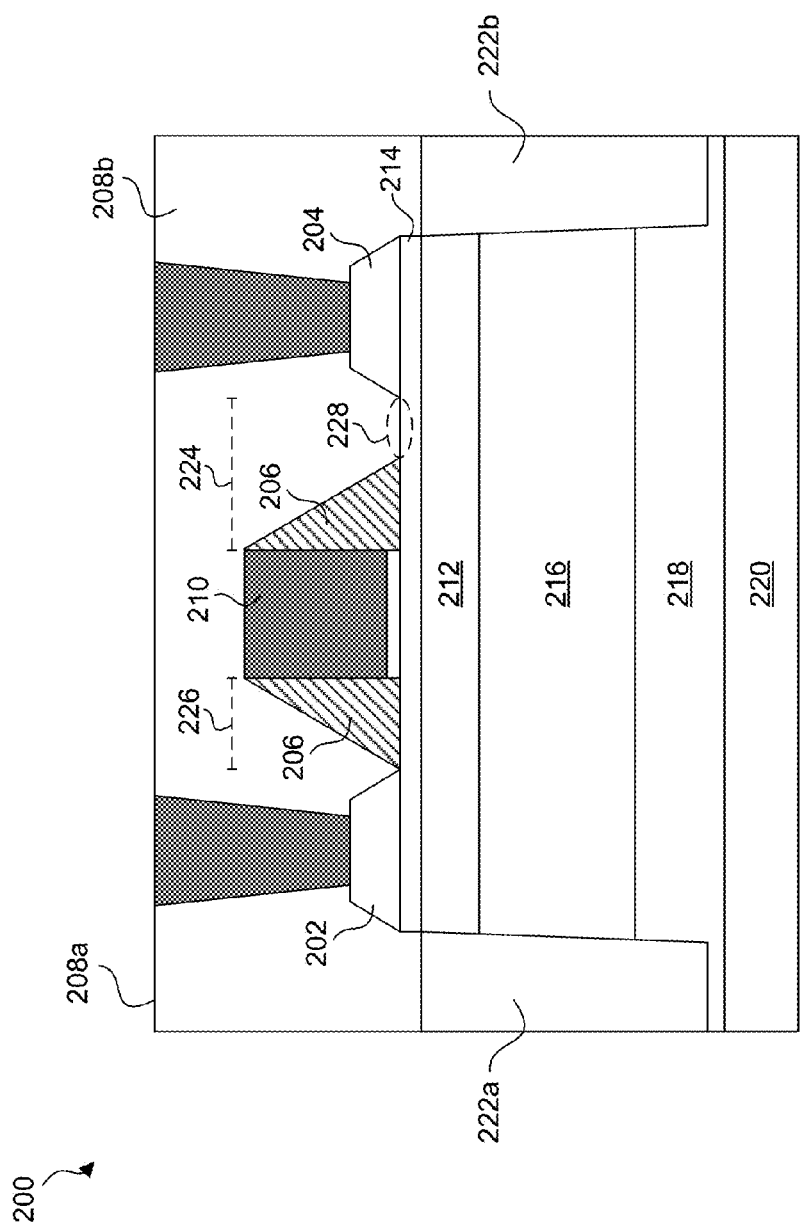
FIG. 2 (Conventional)

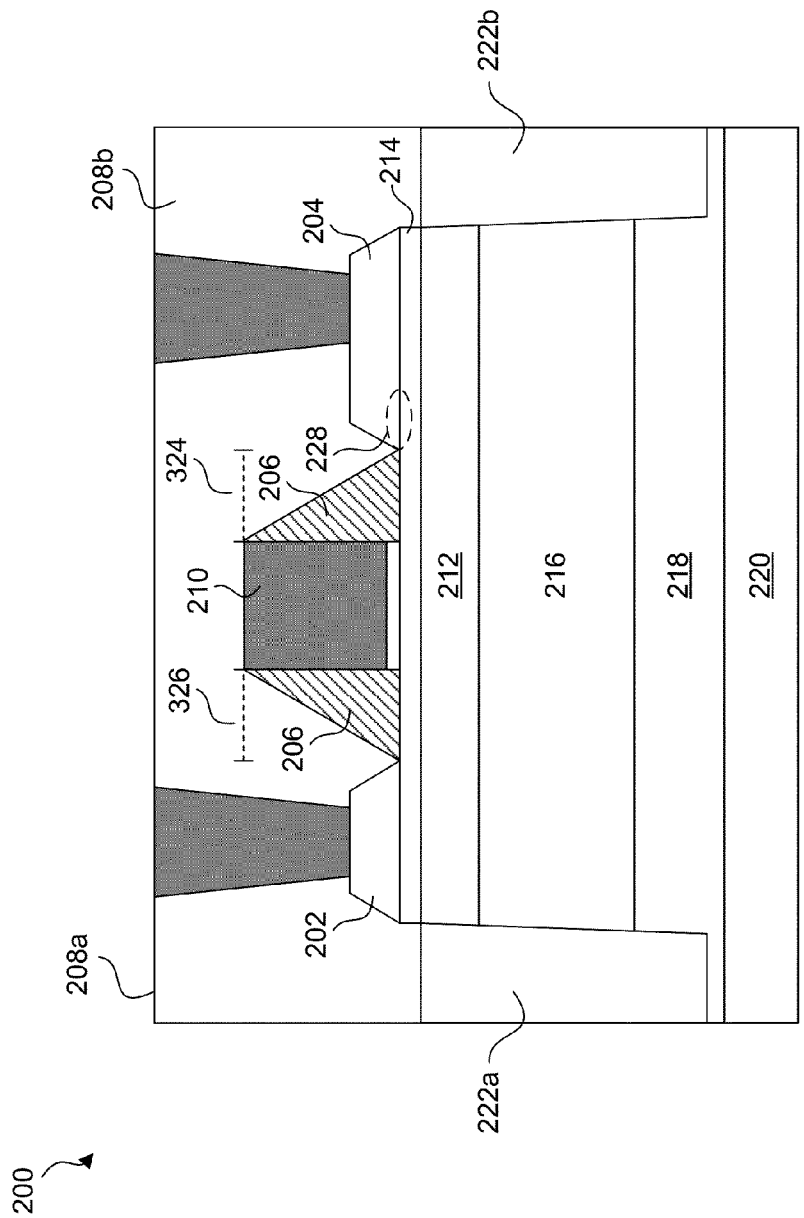
FIG. 3 (Conventional)

EXTENDED DRAIN MOS DEVICE FOR FDSOI DEVICES

CROSS REFERENCE TO RELATED APPLICATIONS

This application claims the benefit of U.S. Provisional Application No. 62/193,958, filed Jul. 17, 2015 which is incorporated herein by reference in its entirety.

FIELD

Embodiments of the present disclosure relate generally to the physical structure of a metal oxide semiconductor (MOS), including implementing an extended drain topology on a fully depleted silicon on oxide (FDSOI) semiconductor device.

BACKGROUND

Advances in semiconductor technologies have resulted in dramatically increased circuit packing densities and higher speeds of operation. In order to achieve such increased densities, a wide variety of evolutionary changes have taken place with respect to semiconductor processing techniques and semiconductor device structures.

As technologies evolve to produce smaller and denser circuits, the evolution has also engendered challenges. As an example, as semiconductor devices are made to be smaller and denser, there applicability to high voltage applications have presented a challenge with respect to the breakdown voltages of the semiconductor device. As an example, an FDSOI device formed on 28 nm nodes can offer higher performance, lower power, and low drain-to-drain voltage (Vdd) as compared to a 28 nm bulk semiconductor device. However, current FDSOI devices do not include high voltage devices such for power amplifier applications and power management due an inadequate breakdown voltage in devices made with smaller process technologies. As the operating voltages applied to the transistors increase, the transistors will eventually breakdown causing an uncontrollable increase in current. Examples of the detrimental effects of the breakdown may include punch-through, avalanche breakdown, and gate oxide breakdown.

BRIEF DESCRIPTION OF THE DRAWINGS

The present disclosure is described with reference to the accompanying drawings. In the drawings, like reference numbers indicate identical or functionally similar elements. Additionally, the left most digit(s) of a reference number identifies the drawing in which the reference number first appears.

FIG. 1 shows an example of a conventional fully depleted silicon on insulator (FDSOI) semiconductor device.

FIG. 2 shows an example of a conventional FDSOI device with an extended drain architecture according to examples of the disclosure.

FIG. 3 shows an example of the conventional extended drain device of FIG. 2 with an unconstrained epitaxial growth according to examples of the disclosure.

DETAILED DESCRIPTION

Figure 4:
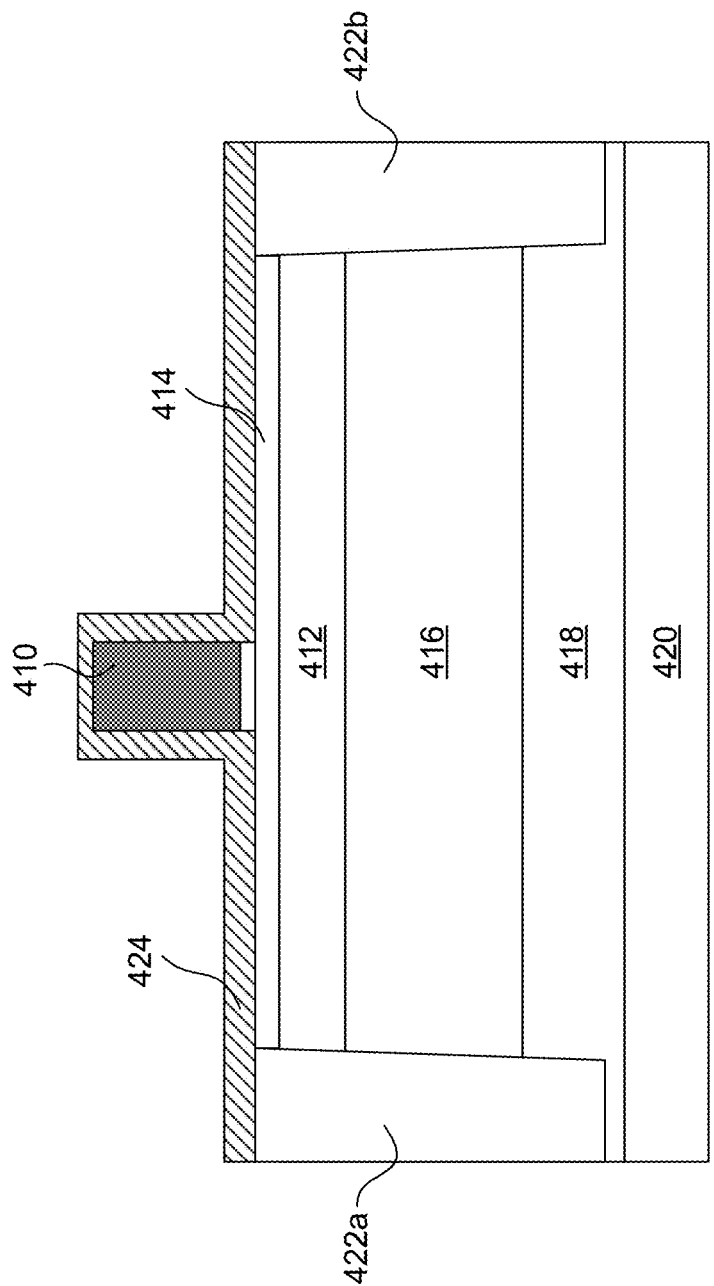
FIG. 4 shows an example FDSOI device during a spacer layer deposition process according to examples of the disclosure.

The following Detailed Description refers to accompanying drawings to illustrate exemplary embodiments consistent with the disclosure, in the following description, numerous specific details are set forth in order to provide a thorough understanding. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure. The exemplary embodiments described herein are provided for illustrative purposes, and are not limiting. Other exemplary embodiments are possible, and modifications can be made to the exemplary embodiments within the spirit and scope of the disclosure.

FIG. 1 shows an example of a conventional fully depleted silicon-on-insulator (FDSOI) semiconductor device. As illustrated in FIG. 1, FDSOI device 100 can include a base silicon layer 120. A deep N-well 118 can be disposed above the base silicon layer 120, in order to reduce effects of noise coupling on the device 100. A N/P well 116 can be disposed above the deep N-well 118. The N/P well 118 is implemented as a P+ well when paired with the deep N-well 118 as shown. Alternatively, the N/P well 118 can be implemented as an N well when paired with a deep P-well. In one example, silicon can be doped with phosphorus to create a N-well, or can be doped with boron to create an P-well.

The N/P well 116 can be biased (i.e., have a voltage applied to it) during operation of the semiconductor device 100. By biasing the N/P well 116, the behavior of the transistor can be controlled not only through the gate but also through the N/P well in a similar manner to the body biasing available in bulk semiconductor technologies.

A buried oxide (BOX) layer 112 can be disposed above the N/P well 116. The BOX layer 112 can be an ultra-thin layer of insulator disposed between the N/P well 116 and a channel layer 114. The BOX layer 112 can have a thickness of approximately 20 nm and acts to reduce parasitic capacitance between the source 102 and the drain 104. Also, the BOX layer 112 allows for the efficient confinement of the electrons that flow from the source to 102 the drain 104 via the channel layer 114, thus reducing performance-degrading leakage currents. The BOX layer 112 can be implemented using $SiO_2$ or other like insulator, or oxide materials.

The channel layer 114 can be implemented using a very thin (approximately 6 nm) silicon film. Due to its thinness, the channel layer 114 can be undoped, which makes the channel layer 114 fully depleted (i.e. substantially devoid of either electron or hole carriers) when unbiased. More specifically, the thinness of the channel layer 114 can allow for more stable control of electron flow within the layer (i.e., reduced leakage currents) thus allowing for the channel layer 114 to be undoped.

A source 102 and a drain 104 are disposed adjacent to the channel layer 114 as illustrated in the figure. Both the source 102 and the drain 104 can be implemented in a raised source/drain (RSD) architecture meaning that they are formed above the channel in whole or in part. The source 102 and drain 104 can either be p or n doped depending on the type of semiconductor device. In the case of the pnp device, the source 102 and drain 104 can be p+ doped and in the case of an npn device the source and drain can be n-doped. The raised/source drain regions are created using epitaxy. In some embodiments of the disclosure, the epitaxy used to grow the raised source/drain regions is a "selective" epitaxy that only grows on silicon based regions of the device that the epitaxial film is exposed to.

The source 102 and drain 104 can be doped using standard doping techniques. In the instance of FDSOI type devices, the doping of the source 102 and the drain 104 can be achieved by implant doping or alternatively by using in-situ doping. In implant doping, the dopants are introduced to the source 102 and the drain 104 after the epitaxial film used to create the raised source/drain regions has been grown. In in-situ doping, the dopants are introduces during the process of growing the epitaxial film on the raised source/drain regions.

A gate structure 110 can be disposed above the channel layer 114 and in between the source 102 and the drain 104 as illustrated in the figure. The gate structure 110 can include a gate dielectric and a gate electrode in an exemplary embodiment. In FIG. 1, the gate structure 110 is illustrated as being equidistant between the source 102 and the drain 104. However in other embodiments to be discussed further below, the gate structure 110 can be spaced so as to be disposed closer to either the source or the drain.

Spacers 106 (denoted as 106a and 106b in the figure) are deposited adjacent to the gate structure 110 as illustrated in FIG. 1 and act to provide the required spacing between the source 102, gate structure 110, and the drain 104.

Deep trench isolation (TI) layers 122 (denoted as 122a and 122b in the figure) can be deposited adjacent to the stack-up of the deep N-well 118, the N/P well 116, the BOX layer 112 as well as the source 102 and drain 104 as illustrated in the figure. A final oxide layer 108 (denoted as 108a and 108b in the figure) is deposited above all of the components of the device 100 to seal the device from the environment.

FDSOI devices can offer higher performance, lower power and low drain-to-drain voltage (Vdd) as compared to a bulk semiconductor device. However, current FDSOI devices do not include high voltage devices such as LDMOS for power amplifier applications and power management due an inadequate breakdown voltage in the device.

As discussed above, extended drain technologies have been known to improve semiconductor device performance by increasing breakdown voltage. Extended drain devices are created by disposing a gate structure of a device such that the gate of the device is disposed closer to the source relative to the drain. By disposing the gate in this manner, the resistance between the source and drain is increased thereby leading to device with a higher breakdown voltage.

FIG. 2 shows an example of a conventional FDSOI device with an extended drain architecture. The device illustrated in FIG. 2 is similar to the device of FIG. 1 and thus the description regarding the silicon layer 220, the deep N-well 218, the N/P well 216, the BOX layer 212, the channel layer 214, the deep trench layer 222, spacers 206, and the oxide layer 208, is similar to that discussed above with respect to the discussion of their counterparts in FIG. 1.

In FIG. 2, the gate 210 is disposed such that it is closer in proximity to the source 202 than the drain 204. In other words, the distance between proximal edges of the source 202 and the gate 210, represented in the figure by distance 226, is less than the distance between proximal edges of the drain 204 and the gate 210, represented in the figure by the distance 224. By disposing the gate accordingly, an extended drain region 228 is created.

The extended drain region 228 acts to increase the resistance between the source 202 and drain 204 with respect to a device that does not include an extended drain region. For instance, the resistance from the gate to the drain for carriers in the channel 214 is increased relative to device 100. As discussed above, the increased resistance allows the device 200 to have a higher breakdown voltage thus making it suitable for higher voltage applications.

The creation of an extended drain region can present challenges with respect to conventional foundry processes. As an example, and as discussed above with respect to FIG. 1, source 102 and drain 104 can be implemented as raised source/drain (RSD) regions. Also as discussed above, the RSD regions can be created using a selective epitaxy that grows only on silicon based regions of the device 100 that is exposed to the epitaxial film. Thus, in order to contain epitaxial growth and isolate the RSD regions to desired areas of the device 100, the exposure to silicon based regions when an epitaxy is deposited should be controlled.

In FIG. 1, a selective epitaxial film can be deposited to create drain 104. As the epitaxial film only grows in areas of exposed silicon, the epitaxial layer can grow above buried oxide layer 112 and channel 114, but will be constrained from growing laterally by spacer 106 and oxide layer 108.

However, by creating an extended drain architecture as pictured in FIG. 2, the mechanisms by which the growth of the epitaxial film is constrained can be inadequate. In FIG. 2, the extended drain 228 contains exposed silicon from channel layer 214, namely the top surface of channel layer 214. As extended drain region 228 has exposed silicon, there is no lateral constraint on the epitaxial film that makes up drain 204.

FIG. 3 shows an example of the extended drain device of FIG. 2 with an unconstrained epitaxial growth. In the absence of any constraint that prevents the epitaxial film that makes up drain 304 from growing laterally towards the gate structure 310, the drain region expands to cover the extended drain region 228, thus effectively substantially nullifying the benefit acquired by implementing an extended drain architecture.

As an example, due to the unconstrained epitaxial growth, the distance between the proximal edges of the source 202 and the gate structure 210, represented in the figure by distance 326, is substantially the same or even slightly more than the distance between proximal edges of the drain 204 and the gate 210, represented in the figure by the distance 324. By not having a constraint on the epitaxial growth of the drain region over the extended drain 228, the benefits gained through the implementation of an extended drain region may be nullified.

The unconstrained epitaxial film of drain 204 covering the extended drain region 228 can lead to performance degradation of the device 200 and is therefore undesirable. In order to create a constraint on epitaxial growth for an extended drain device, what is needed is to alter the foundry process such that the exposed silicon created by the extended drain region 228 is covered thus preventing epitaxial growth from degrading the performance of the extended drain device.

FIG. 4 shows an example FDSOI device during a spacer layer deposition process according to examples of the disclosure. The device illustrated in FIG. 4 is similar to the device of FIG. 1 and thus the description regarding the silicon layer 420, the deep N-well 418, the N/P well 416, the BOX layer 412, the channel layer 414, and the deep trench layer 422 can be found above with respect to the discussion of their counterparts in FIG. 1.

The device illustrated in FIG. 4 is a depiction of an FDSOI device after a spacer layer 424 has been deposited above the deep trench layer 422, the gate structure 410, and the channel layer 414. The material used create the spacer layer 424 can include one of SiN, SiC, SiCN, SiCBN. After the spacer layer 424 is deposited, the layer 424 is manipulated using an optical photolithographic process so as to remove portions of the spacer layer 424 that are not desired.

However, in FIG. 2 in which the extended drain region 228 is created by disposing the gate structure 210 in closer proximity to the source 202 as opposed to the drain 204, the gap between the gate structure 210 and the drain 204 means that the existing epi block mask during a photolithographic process will not produce a spacer layer with a configuration that will constrain the epitaxial growth of the drain 204.

Therefore, in order to create the desired spacer layer (i.e., a spacer layer that covers the extended drain region), the photolithographic process can be altered such that the exposed drain region is covered by the spacer layer, thereby constraining the epitaxial growth of the drain.

Figure 5:
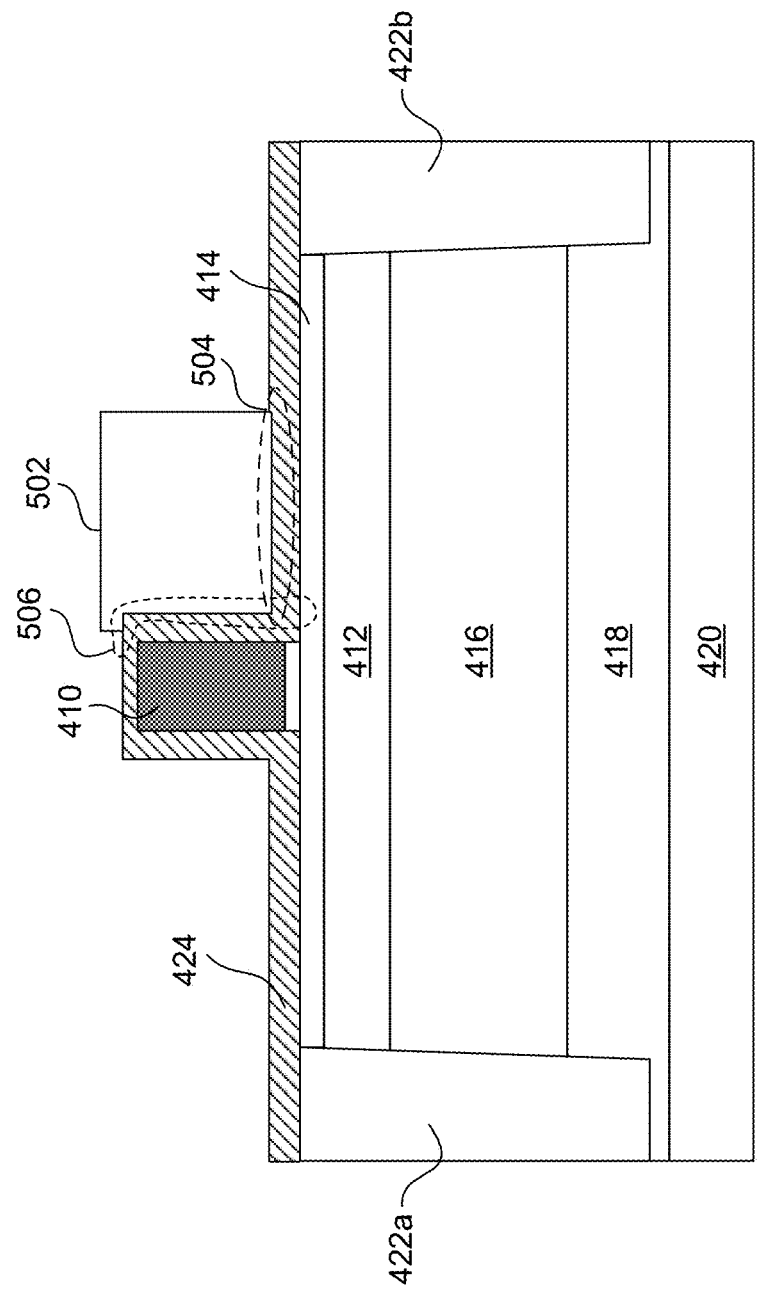
FIG. 5 shows an example of an FDSOI device during a spacer layer deposition process and with a photoresist applied to protect an extended drain region according to examples of the disclosure.

FIG. 5 shows an example of an FDSOI device during a spacer layer deposition process and with a photoresist applied to protect an extended drain region according to examples of the disclosure. A photoresist 502 is applied and then exposed and developed to ensure that it remains in the region shown in FIG. 5. This is followed by an etch (RIE, reactive ion etching) process in which horizontal part of the spacer that is not protected by photoresist 502 is removed.

The photoresist is applied so as to cover the edge of the gate structure 410, depicted by circled portion 506 of FIG. 5, proximal to the side of the device in which the drain (not pictured) will be deposited at a later stage of the foundry process. The photoresist 502 can also be arranged over the spacer layer 424 such that the portion of the spacer layer 424 that currently covers the extended drain region (depicted by circled region 504) remains intact after the etch process.

Figure 6:
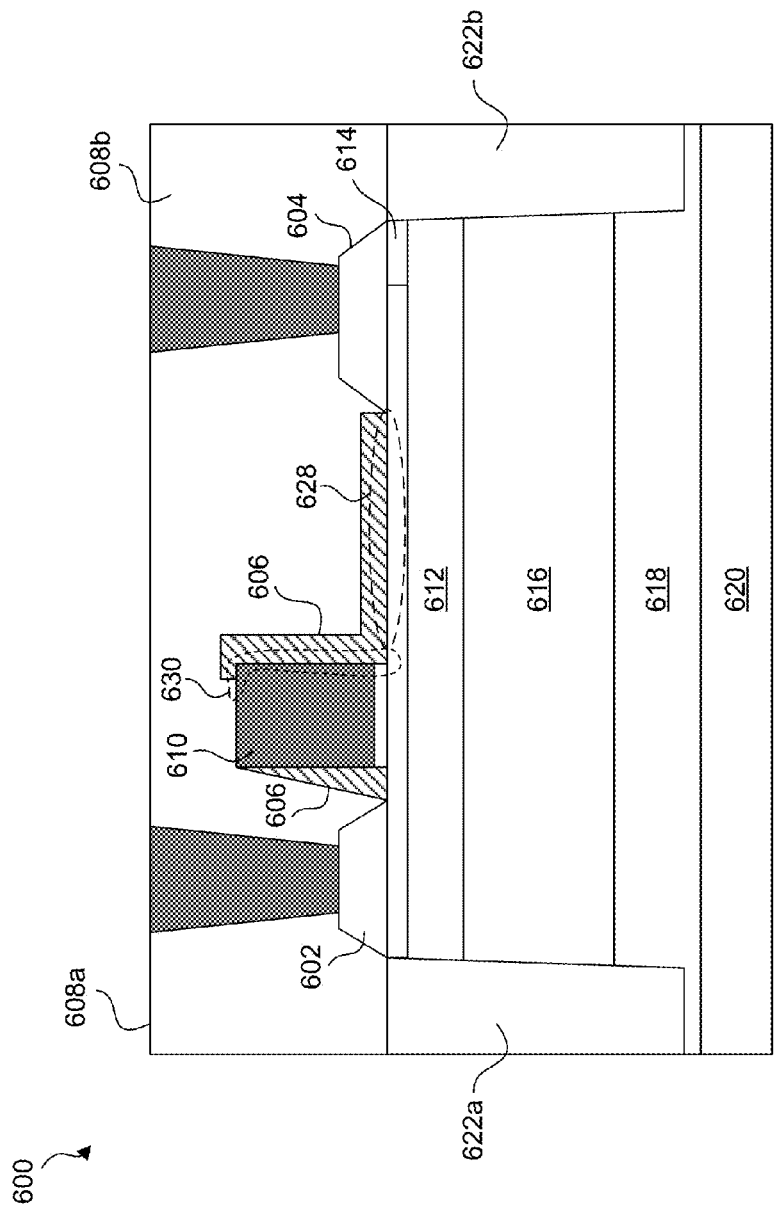
FIG. 6 shows an example FDSOI device with an extended drain architecture that employs a spacer layer to constrain epitaxial growth over the extended drain region according to examples of the disclosure.

FIG. 6 shows an example FDSOI device with an extended drain architecture that employs a spacer layer to constrain epitaxial growth over the extended drain region according to examples of the disclosure. The device depicted in FIG. 6 results in part from the photoresist placement discussed above with respect to FIG. 5.

The device illustrated in FIG. 6 has some overlap with counter parts of FIG. 1 and thus the description regarding the silicon layer 620, the deep N-well 618, the N/P well 616, the BOX layer 612, the channel layer 614, the deep trench layer 622, source 602, drain 605, and the oxide layer 608 can be found above with respect to the discussion of their counterparts in FIG. 1.

Due to the photoresist 502 placement, as discussed above with respect to FIG. 5, the spacer layer 606 now covers a portion of the gate structure 610 (including a portion of the top surface of the gate structure 610) that is proximal to the drain 604 (e.g., the gate portion depicted by circled region 630 that includes the edge of the gate structure). Also the spacer layer 606 covers the extended drain region 628. By covering the extended drain region 628, the epitaxial growth of drain 604 is constrained as all or a substantial amount of the silicon of the extended drain region 628 is covered, thereby limiting the amount of exposed silicon on which the selective epitaxial film can grow upon to form the drain 604. The spacer layer 606 can be described as having an "L" shape between the gate 610 and the drain 604, due to the described method of deposition and photoresist addition and removal. Further the spacer layer 606 has a relatively uniform thickness as shown, which is contrary to the non-uniform thickness of spacers 106, 206.

In other embodiments of the disclosure, a thin oxide layer (approximately 1 nm in thickness) can also be disposed between the spacer layer 606 and any underlying structure that the spacer is disposed upon. This thin oxide layer can help to minimize any interface charges due to the interface between the spacer layer 606 and underlying structures. In yet another embodiment, the 'extended drain region' under 628 can be lightly doped to ensure that the performance or current carrying capability of the device is not compromised. The doping would the same type as the source drain doping but with lower dopant density.

Figure 7:
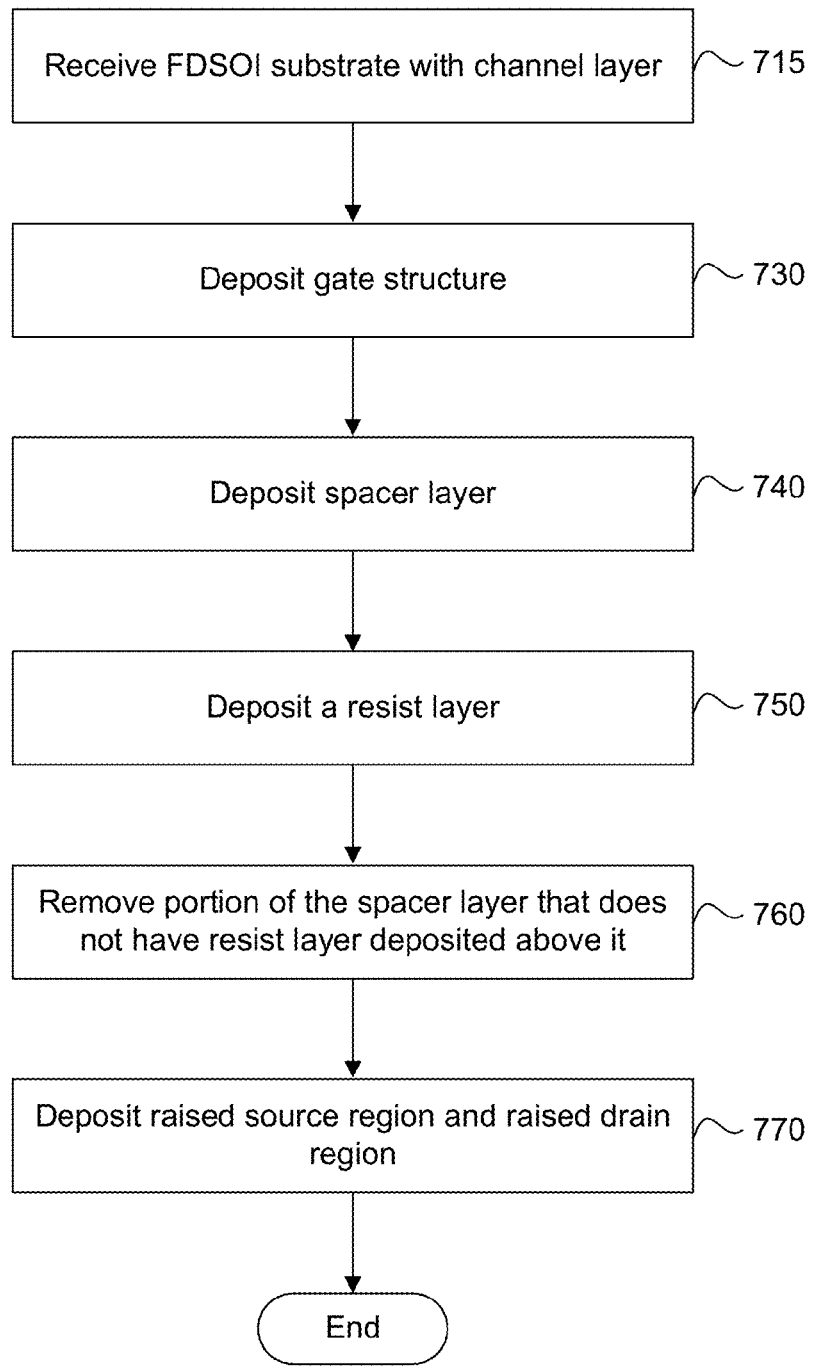
FIG. 7 illustrates an example method of producing an extended drain FDSOI device according to embodiments of the disclosure.

FIG. 7 illustrates an example method of producing an extended drain FDSOI device. At step 715, an FDSOI substrate with a channel layer is received, and/or fabricated. At step 730 a gate structure can be deposited above the channel layer, similar to the gate structure 110 illustrated in FIG. 1 and discussed above. At step 740, a spacer layer can be deposited above the gate structure and channel layer similar to spacer layer 424 illustrated in FIG. 4.

At step 750 a resist layer can be deposited to cover an extended drain region, similar to the resist layer 502 being deposited over extended drain region 504 illustrated in FIG. 5.

At step 760, the portion of the spacer layer that does not have a resist layer deposited above it is removed forming a spacer layer similar to the spacer layer 606 illustrated in FIG. 6. Finally at step 770, a raised source region and raised drain region are grown or deposited similar to the raised source region 602 and the raised drain region 604 depicted in FIG. 6.

While examples of the disclosure above have been illustrated using FDSOI devices, the disclosure is not so limiting and could also apply to bulk devices that possess extended drain architectures similar to the examples discussed above.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance provided herein.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. In addition, the terminology used herein is for the purpose of describing particular embodiments only and is not intended to be limiting. For example, as used herein, the singular forms "a," "an" and "the" are intended to include the plural forms as well, unless the context clearly indicates otherwise. It will be further understood that the terms "comprises," "comprising," "includes" and "including," when used herein, specify the presence of stated features, integers, steps, operations, elements, and components, but do not preclude the presence or addition of one or more other features, integers, steps, operations, elements, components, or groups thereof.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It is to be appreciated that the Detailed Description section, and not the Abstract section, is intended to be used to interpret the following claims. The Abstract section may set forth one or more, but not all exemplary embodiments, of the disclosure, and thus, are not intended to limit the disclosure and the appended claims in any way.

What is claimed is:

1. A semiconductor device, comprising:
   a buried oxide (BOX) layer disposed above a first substrate layer;
   a raised source region disposed above the BOX layer, wherein the raised source region includes a plurality of edges;
   a raised drain region disposed above the BOX layer and laterally spaced apart from the raised source region, wherein the raised drain region includes a plurality of edges;
   a channel layer disposed above and in contact with the BOX layer and disposed between the raised source region and the raised drain region;
   a gate structure disposed above and in contact with the channel layer, wherein the gate structure includes a plurality of edges, and wherein a distance between proximal edges of the gate structure and the raised source region is less than a distance between proximal edges of the gate structure and the raised drain region; and
   a spacer layer disposed above and substantially covering an entire region of the channel layer that lies between the proximal edges of the gate structure and the raised drain region, wherein the spacer layer is of uniform thickness over the entire region between the proximal edges of the gate structure and the raised drain region, and wherein the spacer layer contacts and covers a portion, but not all, of a top surface of a gate electrode of the gate structure.

2. The semiconductor device of claim 1, wherein the spacer layer is disposed such that an epitaxial growth of the raised drain region is substantially constrained to a predefined location.

3. The semiconductor device of claim 1, wherein the raised source region and the raised drain region are doped using in-situ doping techniques.

4. The semiconductor device of claim 1, wherein the semiconductor device is a fully depleted silicon-on-insulator (FDSOI) semiconductor device.

5. The semiconductor device of claim 1, wherein the raised source region, the raised drain region, and the channel layer are disposed above and in contact with a bulk region.

6. The semiconductor device of claim 1, wherein the spacer layer also covers one of the proximal edges of the gate structure and the drain region that defines an edge of the gate structure closest to the drain region, and wherein the spacer layer also has the uniform thickness over the one of the proximal edges of the gate structure and drain region that defines the edge of the gate structure closest to the drain region.

7. The semiconductor device of claim 1, wherein the portion of the top surface of the gate electrode covered by the spacer layer is a relatively small portion of the top surface of the gate electrode.

8. The semiconductor device of claim 7, wherein the spacer layer that contacts and covers the portion of the top surface of the gate electrode also has the uniform thickness.

9. A method, comprising:
   depositing a first substrate layer;
   depositing a raised source region above the first substrate layer, wherein the raised source region includes a plurality of edges;
   depositing a raised drain region above the first substrate layer, wherein the raised drain region includes a plurality of edges, and wherein the raised drain region is spaced apart from the raised source region;
   depositing a channel layer above the first substrate layer between the raised source region and the raised drain region;
   depositing a gate structure above and in contact with the channel layer, wherein the gate structure includes a plurality of edges and wherein a distance between proximal edges of the gate structure and the raised source region is less than a distance between proximal edges of the gate structure and the raised drain region;
   depositing a spacer layer above the raised source region, the gate structure, the channel layer, and the raised drain region;
   depositing a resist layer over and substantially covering a region of the channel layer that lies between the proximal edges of the gate structure and the raised drain region; and
   removing a portion of the spacer layer that does not have the resist layer deposited above it.

10. The method of claim 9, wherein the spacer layer is deposited and the portion of the spacer layer is removed so as substantially constrain an epitaxial growth of the raised drain region to a predefined location.

11. The method of claim 9, wherein the raised source region and the raised drain region are doped using in-situ doping techniques.

12. The method of claim 9, wherein the method is implemented on a fully depleted silicon-on-insulator (FDSOI) semiconductor device.

13. The method of claim 12, wherein the channel layer is disposed above and in contact with a buried oxide (BOX) layer.

14. The method of claim 9, wherein the spacer layer is deposited above and in contact with the channel layer.

15. The method of claim 9, further comprising:
depositing a thin oxide layer above and in contact with the portion of the channel layer disposed between the proximal edges of the gate structure and the raised drain region.

16. The method of claim 9, wherein the raised source region, the raised drain region, and the channel layer are disposed above and in contact with a bulk region.

17. A semiconductor device, comprising:
a source region and a drain region;
a channel layer disposed between the source region and the drain region, wherein the channel layer is disposed above and in contact with a buried oxide (BOX) layer;
a gate structure disposed over the channel layer and between the source region and the drain region and configured to control a conductivity of the channel layer between the source region and the drain region, wherein the gate structure is disposed closer to the source region than the drain region so that a first distance defined between proximal edges of the gate structure and the drain region is greater than a second distance defined between proximal edges of the gate structure and the source region; and
a spacer layer disposed above and substantially covering a region of the channel that lies the proximal edges of the gate structure and the drain region;
wherein the spacer layer also contacts and covers a portion, but all, of a top surface of a gate electrode of the gate structure.

18. The semiconductor device of claim 17, wherein the spacer layer also covers one of the proximal edges of the gate structure and the drain region that defines an edge of the gate structure closest to the drain region.

19. The semiconductor device of claim 18, wherein the spacer layer is disposed such that an epitaxial growth of the drain region is substantially constrained to a predefined location that is separated from the gate structure by the first distance.

20. The semiconductor device of claim 18, wherein the spacer layer has a uniform thickness over the portion of the top surface of the gate electrode of the gate structure and over the region of the channel layer that lies between the proximal edges of the gate structure and the drain region.

21. The semiconductor device of claim 20, wherein the spacer layer also has the uniform thickness over the one of the proximal edges of the gate structure and drain region that defines the edge of the gate structure closest to the drain region.

22. The semiconductor device of claim 17, wherein the portion of the top surface of the gate electrode covered by the spacer layer is a relatively small portion of the top surface of the gate electrode.

* * * * *

UNITED STATES PATENT AND TRADEMARK OFFICE
CERTIFICATE OF CORRECTION

PATENT NO. : 9,799,524 B2
APPLICATION NO. : 14/929054
DATED : October 24, 2017
INVENTOR(S) : Ito et al.

Page 1 of 1

It is certified that error appears in the above-identified patent and that said Letters Patent is hereby corrected as shown below:

In the Claims

In Column 10, Line 5, replace "but all" with --but not all--.

Signed and Sealed this
Twenty-eighth Day of May, 2019

Andrei Iancu
*Director of the United States Patent and Trademark Office*